(12) United States Patent
Wenzel et al.

(10) Patent No.: US 7,031,677 B2
(45) Date of Patent: Apr. 18, 2006

(54) OPTIMIZATION OF THE OPERATING POINT OF POWER AMPLIFIERS IN MOBILE STATIONS

(75) Inventors: Dietmar Wenzel, München (DE);
Stephan Weber, München (DE)

(73) Assignee: Infineon Technologies AG, Munich (DE)

( * ) Notice: Subject to any disclaimer, the term of this patent is extended or adjusted under 35 U.S.C. 154(b) by 558 days.

(21) Appl. No.: 09/895,595

(22) Filed: Jun. 29, 2001

(65) Prior Publication Data

US 2003/0003940 A1    Jan. 2, 2003

(51) Int. Cl.
*H04B 1/04* (2006.01)

(52) U.S. Cl. .................. 455/127.2; 455/126; 455/69; 330/129

(58) Field of Classification Search ............ 455/127.1, 455/127.2, 127.3, 127.4, 127.5, 343.1, 343.2, 455/343.3, 343.5, 571, 572, 573, 574, 343, 455/522, 69, 245.1, 247.1, 250.1, 126, 550.1; 330/123, 129, 149, 251, 286; 375/297
See application file for complete search history.

(56) References Cited

U.S. PATENT DOCUMENTS

| | | | |
|---|---|---|---|
| 5,278,994 A | * | 1/1994 | Black et al. ................. 455/126 |
| 5,278,997 A | | 1/1994 | Martin |
| 5,426,641 A | * | 6/1995 | Afrashteh et al. .......... 370/347 |
| 5,509,011 A | * | 4/1996 | Birth .......................... 370/498 |
| 5,603,106 A | * | 2/1997 | Toda .......................... 455/126 |
| 5,625,322 A | * | 4/1997 | Gourgue et al. ............ 330/129 |
| 5,841,319 A | * | 11/1998 | Sato ............................ 330/129 |
| 5,909,643 A | * | 6/1999 | Aihara ..................... 455/127.3 |
| 6,304,145 B1 | * | 10/2001 | Laureanti et al. ........... 330/285 |
| 6,418,304 B1 | * | 7/2002 | Morrar ..................... 455/343.1 |
| 6,677,819 B1 | * | 1/2004 | Hakala et al. .............. 330/136 |
| 2002/0071482 A1 | * | 6/2002 | Peters et al. ................ 375/222 |

FOREIGN PATENT DOCUMENTS

| | | |
|---|---|---|
| DE | 44 39 826 A1 | 5/1996 |
| EP | 0 601 410 B1 | 6/1994 |
| EP | 0 896 439 A2 | 2/1999 |
| FR | 2 868 574 A1 | 3/1999 |
| WO | 00/48307 | 8/2000 |
| WO | WO 00/55968 * | 9/2000 |

* cited by examiner

*Primary Examiner*—Tilahun Gesesse
(74) *Attorney, Agent, or Firm*—Laurence A. Greenberg; Werner H. Stemer; Ralph E. Locher

(57) ABSTRACT

An additional control voltage is used to adjust then operating point of a power amplifier. The amplitude of the control voltage is a measure of the maximum gain needed during the current time slot and which is already provided to the power amplifier before the beginning of the active time slot. This enables an individual adjustment of the operating point so that the power consumption can be reduced.

25 Claims, 3 Drawing Sheets

OPTIMIZATION OF THE OPERATING POINT OF POWER AMPLIFIERS IN MOBILE STATIONS

BACKGROUND OF THE INVENTION

Field of the Invention

The present invention relates to a device and a method for optimizing the operating point of power amplifiers in mobile stations.

In transmitting devices in mobile stations MS, power amplifiers PA are used which amplify the transmit signal, which is modulated by the data to be transmitted, before it is supplied to the antenna. The energy necessary for this is taken from the battery contained in the mobile station MS. The required effective radiated power depends on a number of parameters such as the distance of the mobile station MS from the base station, the radio-frequency channel loss, the noise of the radio-frequency channel, the spectral characteristics of the radio-frequency channel, the transmission method, etc. To save energy and thus to achieve the longest possible battery life, the radiated power is adapted in accordance with one or more of these parameters.

In mobile radio systems based on the time division multiplex (TDM) method, the radiated power is generally specified separately for each time slot and is constant for the duration of the time slot. As a rule, the radiated power can be selected in steps and a maximum radiated power must not be exceeded. Between the active time slots, the power amplifier is switched off.

Before the beginning of an active time slot, the power amplifier is switched on and the gain is gently ramped up from minimum to the desired value by a control signal v(t) generated in the MS, in such a manner that no noise spectra interfering with the neighboring channels occur. The course of this gain or power ramp is determined by a power ramp controller. During the active phase of the time slot, the gain is kept approximately constant and ramped down again at the end.

So that the power amplifier can produce the gain required in each case, its operating point (OP) must be correspondingly selected. Since it is not obvious from the control signal v(t) at the beginning of an active time slot what maximum gain $v_{max}$ is needed in the active part of the time slot, it must be assumed that it can also be the greatest gain $v_0$ which can be set. For this reason, the operating point OP must be selected in such a manner right at the start that the power amplifier can produce the greatest possible gain $v_0$. In most cases, however, the maximum possible gain $v_0$ is not needed within an active time slot.

However, the basic current consumption of the power amplifier depends on the operating point OP selected. The higher it is selected to be, the greater the current consumption. If thus the operating point OP is selected to be unnecessarily high at low radiated powers, the efficiency is correspondingly low and the battery is unnecessarily loaded which shortens the battery life.

SUMMARY OF THE INVENTION

It is accordingly an object of the invention to provide an apparatus and a method for optimizing the operating point of a power amplifier in a mobile radio station, which overcome the above-mentioned disadvantageous of the prior art apparatus and methods of this general type. In particular, the apparatus and the method enable the efficiency of the mobile radio station to be improved and, at the same time, enable the required radiated power to always available.

With the foregoing and other objects in view there is provided, in accordance with the invention a method for optimizing an operating point of a power amplifier in a mobile station, that includes using a control signal to adapt an operating point of a power amplifier to the maximum power gain that is needed within a particular time interval.

In accordance with an added feature of the invention, an analog signal is used as the control signal.

In accordance with an additional feature of the invention, an analog voltage signal is used as the control signal.

In accordance with another feature of the invention, the control signal is provided as a digital signal which allows the operating point to be switched in steps.

In accordance with a further feature of the invention, the control signal is generated in a chip that includes components selected from the group consisting of a power ramp controller and a D/A converter.

In accordance with a further added feature of the invention, an analog voltage signal is used as the control signal; and a D/A converter for setting the operating point is integrated in the power amplifier.

In accordance with a further additional feature of the invention, the control signal is also used to switch the power amplifier on and off.

In accordance with another added feature of the invention, the power gain of the power amplifier is set independently of the control signal for adapting the operating point.

In accordance with another additional feature of the invention, the control signal for adapting the operating point is provided with an adjustable timing relationship with respect to a power ramp control signal.

In accordance with yet an added feature of the invention, a common sequence controller is used to control the timing of the setting of the operating point and the timing of a power ramp.

In accordance with yet an additional feature of the invention, an analog voltage signal is used as the control signal; and a D/A converter for the control signal is switched off during inactive time slots.

In accordance with yet another feature of the invention, the power amplifier is provided in a mobile station.

In accordance with yet a further feature of the invention, the power amplifier is provided in a mobile station that supports a standard selected from the group consisting of a GSM standard, a EDGE standard, a TIA/EIA-136 standard (IS-136), a UMTS standard, and a part-combination including any of the stated standards.

With the foregoing and other objects in view there is provided, in accordance with the invention the combination of a power amplifier that has an operating point and that is located in a mobile station, and a device providing a control signal that adapts the operating point of the power amplifier to the maximum power gain that is needed within a certain time interval.

A significant aspect of the invention lies in the fact that an additional control voltage is used. The amplitude of the additional control voltage is a measure of the maximum gain $v_{max}$ that is needed during the current time slot and that is already provided to the power amplifier before the beginning of the active time slot. In this manner, an individual adjustment of the operating point is made possible, with the aim of reducing the power consumption.

The device for optimizing the operating point includes a D/A converter 40 having an input receiving, from a system controller 10, at least one digital value 13 per time slot. The D/A converter 40 outputs an analog value 41 to the power amplifier 60. The analog value 41 is based on the digital value 13 and is synchronized in time with the sequence controller by means of the signal.

This embodiment of the invention offers the following advantages:

a) The system controller 10, which also defines the shape and amplitude of the power ramps and transmits these to the power ramp controller 20 through the connection 11, thus also knows the maximum gain $v_{max}$ needed in a time slot and the system controller 10 can therefore also determine the digital value 13 which it supplies to the D/A converter 40;

b) The operating point can be set before the beginning of the time slot;

c) The precise time when a new analog value 41 is to be output can be precisely synchronized with the power ramp and the time slot through the link 33 with the sequence controller 30; and d) The arrangement can be completely integrated in the chip which is used for controlling the power amplifier.

Furthermore, the following special features can be seen:

a) Since the gain is still determined only by the signal v(t), the system is also compatible with power amplifiers which do not have any capability for being able to individually adjust the operating point.

b) The D/A converter can be switched off in the time intervals between active time slots to save current as is generally also the case with the power ramp controller and the power amplifier.

Thus, a time-slot-specific optimization of the operating point can be performed in the invention. The operating point of the power amplifier of the mobile radio station can be set for each time slot in accordance with the radiated power required in this time slot or, respectively, the required gain of the power amplifier. The operating point of the power amplifier thus does not need to be set to be higher for each time slot than for the maximum gain $v_{max}$ required in this time slot.

According to the invention, it is possible to set the operating point of the power amplifier even before the beginning of the power ramp. Furthermore, the variation with time and the amplitude of the gain can be exclusively specified by the control signal v(t). To implement the invention, only one additional signal output is needed at a maximum.

Other features which are considered as characteristic for the invention are set forth in the appended claims.

Although the invention is illustrated and described herein as embodied in optimization of the operating point of power amplifiers in mobile stations, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
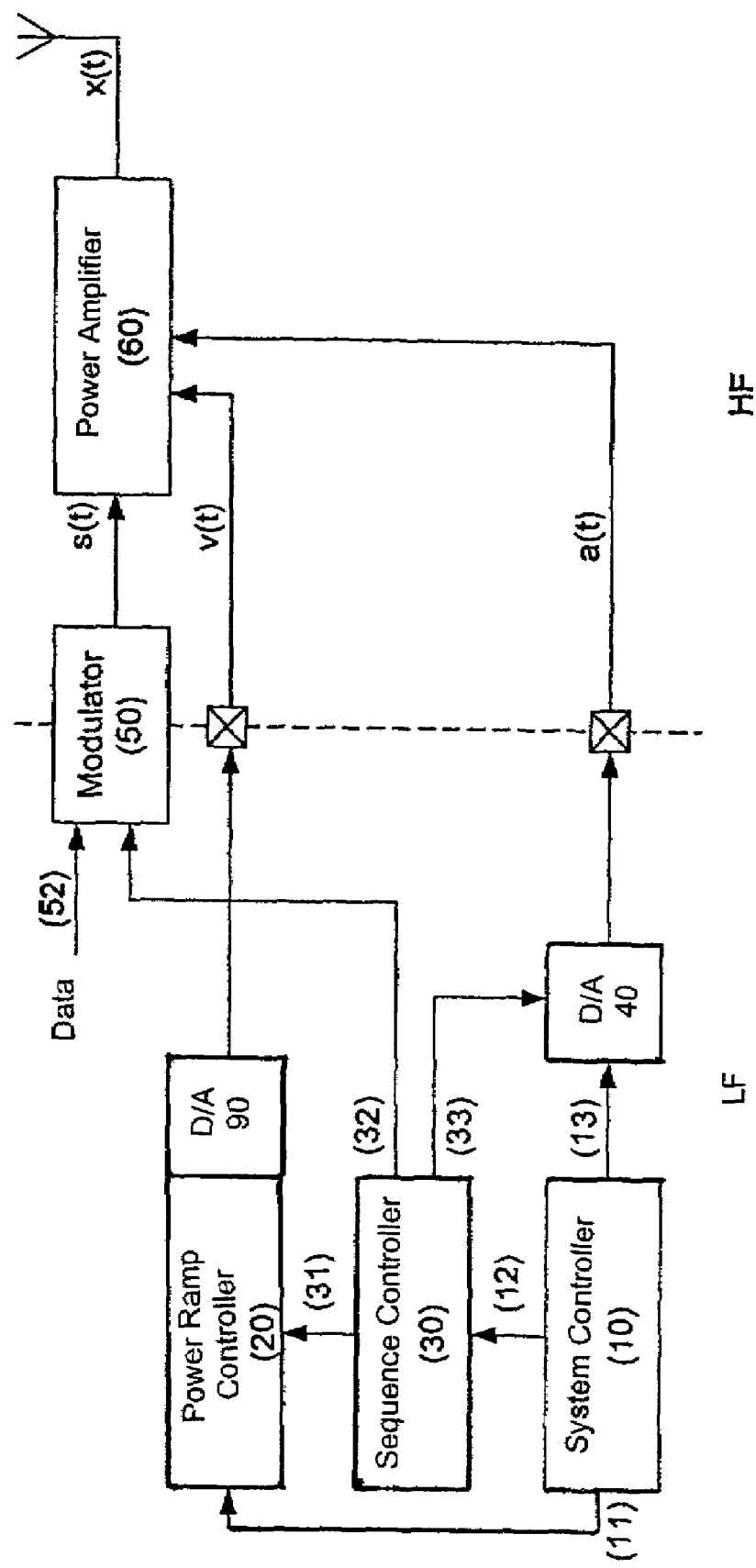
FIG. 1 shows a block diagram of an exemplary embodiment of a device according to the invention for optimizing the operating point.

Referring now to the figures of the drawing in detail and first, particularly, to FIG. 1 thereof, there is shown a device which contains all of the required elements for the most general form of the invention and additional further special embodiments, and which shows additional blocks which are of advantage for understanding the system.

The device in FIG. 1 includes a system controller 10 which transmits data for the power ramps 11 to the power ramp controller 20 and synchronization information 12 to the sequence controller 30. The power ramp controller 20, in turn, with the aid of the D/A converter 90, outputs the power ramp as an analog signal v(t) at the times specified by the sequence controller 30 by means of the synchronization information 31. The signal v(t) is supplied to the power amplifier 60. The power amplifier 60 determines its gain, and thus the power level of the transmit signal x(t).

From the data 52, the modulator 50 forms the modulated signal s(t), which is synchronized in time with the power ramp by means of the synchronization information 32, and which is amplified by the power amplifier 60 and is output as the transmit signal x(t).

As an additionally inventive feature, the device shown in FIG. 1 includes a D/A converter 40 which has an input receiving digital values 13 from the system controller 10. The D/A converter 40 outputs an analog signal a(t), obtained from the digital value 13, after having been requested to do so by the sequence controller 30, e.g. by means of a pulse, via the synchronization line 33. The signal a(t) corresponds to the maximum gain $v_{max}$ needed in the associated time slot and remains unchanged until a new digital value 13 is present at the input and a pulse has been sent by the sequence controller. If the D/A converter is switched off, the value a(t)=0 V is output.

The signal a(t) is supplied to the power amplifier 60, where it is used as a parameter for setting the operating point and/or other amplifier parameters.

Figure 2:
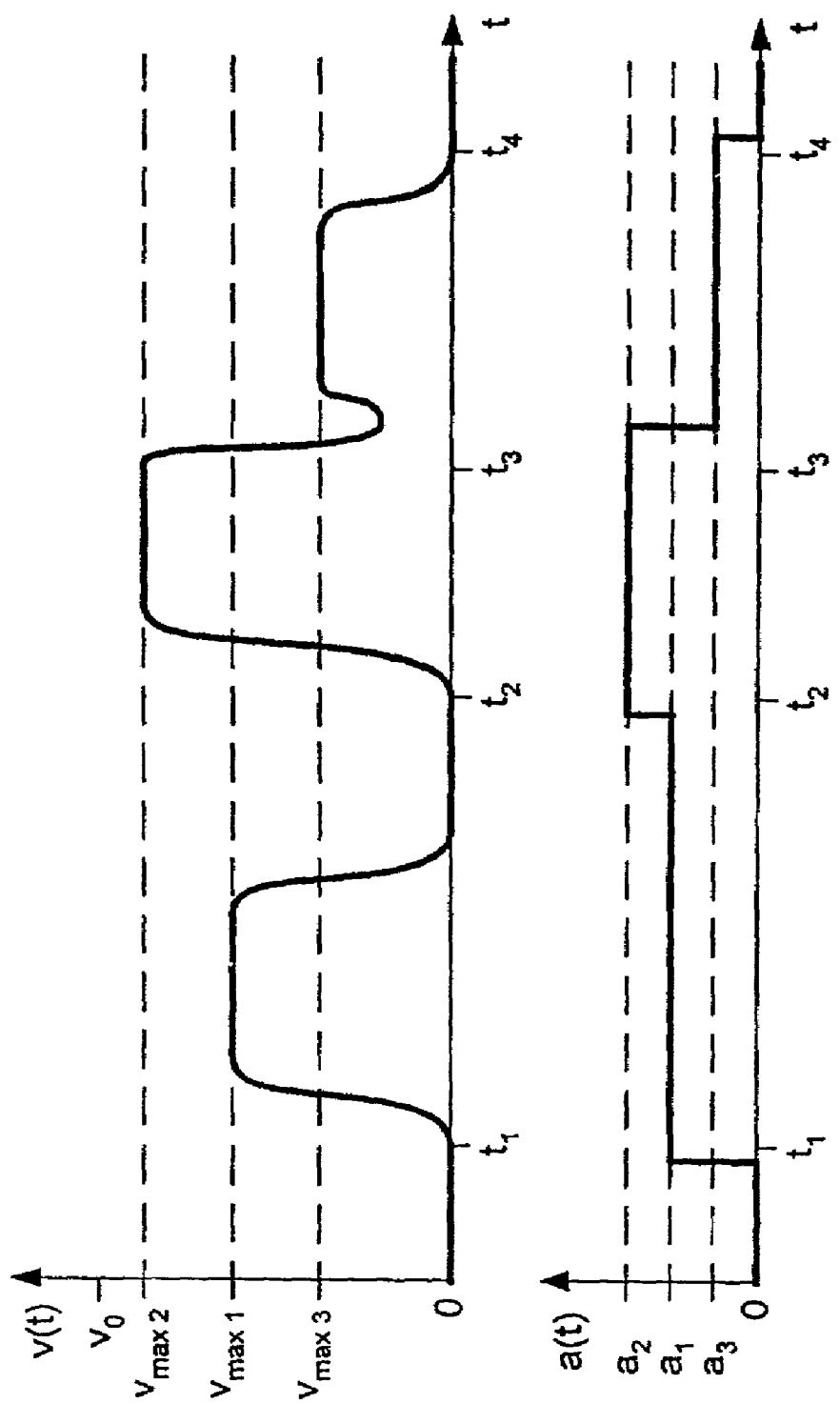
FIG. 2 shows a timing diagram for the v(t) and a(t) signals for a sequence of different time slots.

FIG. 2 shows by way of example the simplified variation of the signals v(t) and a(t) with time for a sequence of different time slots. The signal a(t) is output before the beginning of the power ramp in order to bring the power amplifier to the corresponding operating point. In the case of successive active time slots, the operating point is switched over during the transition phase.

Times t1–t4 mark the following phases:

t1 is the beginning of the power ramp which ramps the gain up to $v_{max1}$ and down;

t2 is the beginning of the power ramp which ramps the gain up to $v_{max2}$;

t3 is the beginning of the power ramp which ramps the gain down from vmax.2 to $v_{max3}$; and t4 is the end of the transmit sequence.

Figure 3:
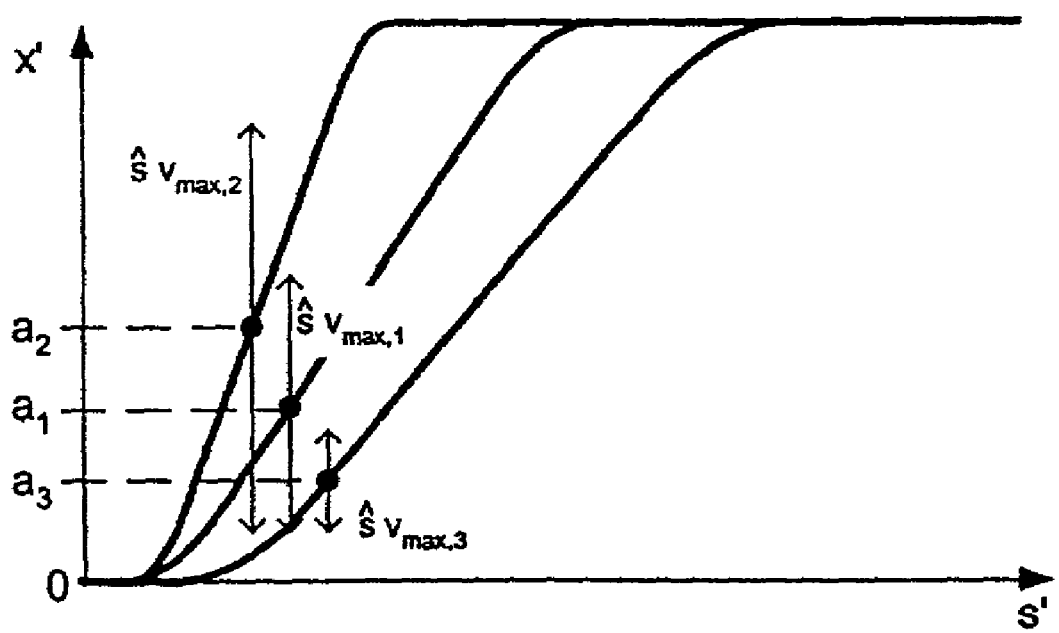
FIG. 3 shows an exemplary diagram for setting the operating points.

FIG. 3 shows, by way of example, the setting of the operating points of the power amplifier 60 and the modulation ranges of the transmit signal for the operating conditions shown in FIG. 2. Ŝ is the maximum amplitude of the modulated signal s(t) 51.

We claim:

1. A method for optimizing an operating point of a power amplifier in a mobile station, which comprises:

using control signals to adapt an operating point of a power amplifier to a maximum power gain that is needed within a time slot of data transmission, the control signals including a first control signal for setting the maximum power gain and a second control signal for initiating generation of the operating point, wherein the maximum power gain and the operating point are switched over during a transition phase between successive active time slots.

2. The method according to claim 1, which comprises using an analog signal as one of the control signals.

3. The method according to claim 1, which comprises using an analog voltage signal as one of the control signals.

4. The method according to claim 1, which comprises providing one of the control signals as a digital signal which allows the operating point to be switched in steps.

5. The method according to claim 1, which comprises:
generating the control signals in a chip that includes components selected from the group consisting of a power ramp controller and a D/A converter.

6. The method according to claim 1, which comprises:
using an analog voltage signal as one of the control signals; and
integrating in the power amplifier, a D/A converter for setting the operating point.

7. The method according to claim 1, which comprises also using one of the control signals to switch the power amplifier on and off.

8. The method according to claim 1, which comprises setting or selecting a power gain of the power amplifier independently of the first control signal.

9. The method according to claim 1, which comprises providing the first control signal with an adjustable timing relationship with respect to the second control signal being a power ramp control signal.

10. The method according to claim 9, which comprises:
setting the first control signal to have a constant value during a duration of the particular time interval; and
outputting the first control signal to the power amplifier before the power ramp control signal is outputted to the power amplifier.

11. The method according to claim 1, which comprises using a common sequence controller to control a timing of the adaptation of the operating point and a timing of a power ramp.

12. The method according to claim 1, which comprises:
using an analog voltage signal as one of the control signals; and
switching a D/A converter f or the one control signal off during inactive time slots.

13. The method according to claim 1, which comprises providing the power amplifier in a mobile station.

14. The method according to claim 1, which comprises providing the power amplifier in a mobile station that supports a standard selected from the group consisting of a GSM standard, a EDGE standard, a TIA/EIA-136 standard, a UMTS standard, and a part-combination including any of the stated standards.

15. In combination with a power amplifier that has an operating point and that is located in a mobile station, a device providing control signals for adapting the operating point of the power amplifier to a maximum power gain needed within a time slot of data transmission, the control signals including a first control signal for setting the maximum power gain and a second control signal for initiating generation of the operating point, the maximum gain and the operating point being switched over during a transition phase between successive time slots.

16. The device according to claim 15, wherein one of the control signals is an analog control voltage.

17. The device according to claim 15, wherein one of the control signals is a digital signal which allows the operating point to be switched in steps.

18. The device according to claim 15, comprising a D/A converter integrated in the power amplifier, said D/A converter being required for setting the operating point of the power amplifier.

19. The device according to claim 15, comprising:
a chip including a component selected from the group consisting of a power ramp controller and a D/A converter;
one of the control signals for adapting the operating point being generated in said chip.

20. The device according to claim 15, wherein one of the control signals can be used at the same time for switching the power amplifier on and off.

21. The device according to claim 15, wherein the power gain is set independently of at least one of the control signals.

22. The device according to claim 15, wherein the first control signal has a defined and an adjustable timing relationship with respect to second control signal being a power ramp control signal.

23. The device according to claim 15, comprising a common sequence controller for controlling timing of a setting of the operating point and for controlling timing of a power ramp.

24. The device according to claim 15, comprising:
a D/A converter for one of the control signals, said D/A converter can be switched off during inactive time slots;
the one control signal being an analog control voltage.

25. The combination according to claim 15, wherein the mobile station supports a standard selected from the group consisting of a GSM standard, a EDGE standard, a TIA/EIA-136 standard a UMTS standard, and a part-combination including any of the stated standards.

* * * * *